United States Patent
Perner et al.

(10) Patent No.: US 6,826,094 B1
(45) Date of Patent: Nov. 30, 2004

(54) MAGNETIC MEMORY CELL SENSING WITH FIRST AND SECOND CURRENTS

(75) Inventors: Frederick Perner, Palo Alto, CA (US); Kenneth Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 10/452,755

(22) Filed: Jun. 2, 2003

(51) Int. Cl.⁷ .............................................. G11C 11/24
(52) U.S. Cl. .................. 365/189.07; 365/149; 365/171
(58) Field of Search ............................ 365/189.07, 149, 365/171, 158, 189.08, 225.5, 207, 208, 209, 210, 173

(56) References Cited

U.S. PATENT DOCUMENTS

| | | | |
|---|---|---|---|
| 6,188,615 B1 | 2/2001 | Perner et al. | |
| 6,259,644 B1 | 7/2001 | Tran et al. | |
| 6,317,375 B1 | 11/2001 | Perner | |
| 6,317,376 B1 | 11/2001 | Tran et al. | |
| 6,707,710 B1 * | 3/2004 | Holden | 365/158 |
| 2001/0024396 A1 * | 9/2001 | Bohm et al. | 365/210 |
| 2002/0136049 A1 * | 9/2002 | Choi et al. | 365/145 |
| 2004/0032760 A1 * | 2/2004 | Baker | 365/148 |

* cited by examiner

Primary Examiner—Richard Elms
Assistant Examiner—Dang Nguyen

(57) ABSTRACT

A magnetic memory includes a sense amplifier coupled to a memory cell. The sense amplifier includes a capacitor operative between a first voltage established by a first sense current flowing in a first direction and corresponding to an unknown logic state of the memory cell, and a second voltage established by a second sense current flowing in a second direction and corresponding to a known logic state of the memory cell. The sense amplifier includes detect logic configured to compare the second voltage to an upper and lower threshold voltage and provide the known logic state if the second voltage is less than the upper threshold voltage and greater than the lower threshold voltage, and provide a logic state opposite to the known logic state if the second voltage is equal to or greater than the upper threshold voltage or is equal to or less than the lower threshold voltage.

26 Claims, 5 Drawing Sheets

MAGNETIC MEMORY CELL SENSING WITH FIRST AND SECOND CURRENTS

THE FIELD OF THE INVENTION

The present invention generally relates to the field of magnetic memories. More particularly, the present invention relates to sensing a logic state stored in a magnetic memory cell with first and second currents.

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations are referred to as "parallel" and "anti-parallel" orientations. With parallel orientation, the orientation of magnetization in the data storage layer is substantially parallel to the magnetization in the reference layer along the easy axis and the magnetic memory cell is in a low resistance state which can be represented by the value R. With anti-parallel orientation, the orientation of magnetization in the data storage layer is substantially anti-parallel to the magnetization in the reference layer along the easy axis and the magnetic memory cell is in a high resistance state which can be represented by the value R+ΔR. A sense amplifier can be used to sense the resistance state of a selected magnetic memory cell to determine the logic state stored in the memory cell.

Sensing the resistance state of selected magnetic memory cells can be unreliable. Manufacturing variations in the dimensions or shapes or in the thicknesses or crystalline anisotropy of the data storage layers of the magnetic memory cells can cause variations across a wafer in the memory cell R and R+ΔR resistance values. Variations in operating conditions of the magnetic memories such as temperature can also cause variations in the memory cell R and R+ΔR resistance values.

SUMMARY OF THE INVENTION

One embodiment of the present invention provides a magnetic memory that includes a memory cell and a sense amplifier coupled to the memory cell. The sense amplifier comprises a capacitor operative between a first voltage established by a first sense current flowing in a first direction and a second voltage established by a second sense current flowing in a second direction. The first sense current corresponds to an unknown logic state of the memory cell and the second sense current corresponds to a known logic state of the memory cell. The sense amplifier also comprises detect logic configured to compare the second voltage to an upper and lower threshold voltage and provide the known logic state if the second voltage is less than the upper threshold voltage and greater than the lower threshold voltage, and provide a logic state opposite to the known logic state if the second voltage is equal to or greater than the upper threshold voltage or is equal to or less than the lower threshold voltage.

DETAILED DESCRIPTION

In the following detailed description of the preferred embodiments, reference is made to the accompanying drawings which form a part hereof, and in which is shown by way of illustration specific embodiments in which the invention may be practiced.

Figure 1:
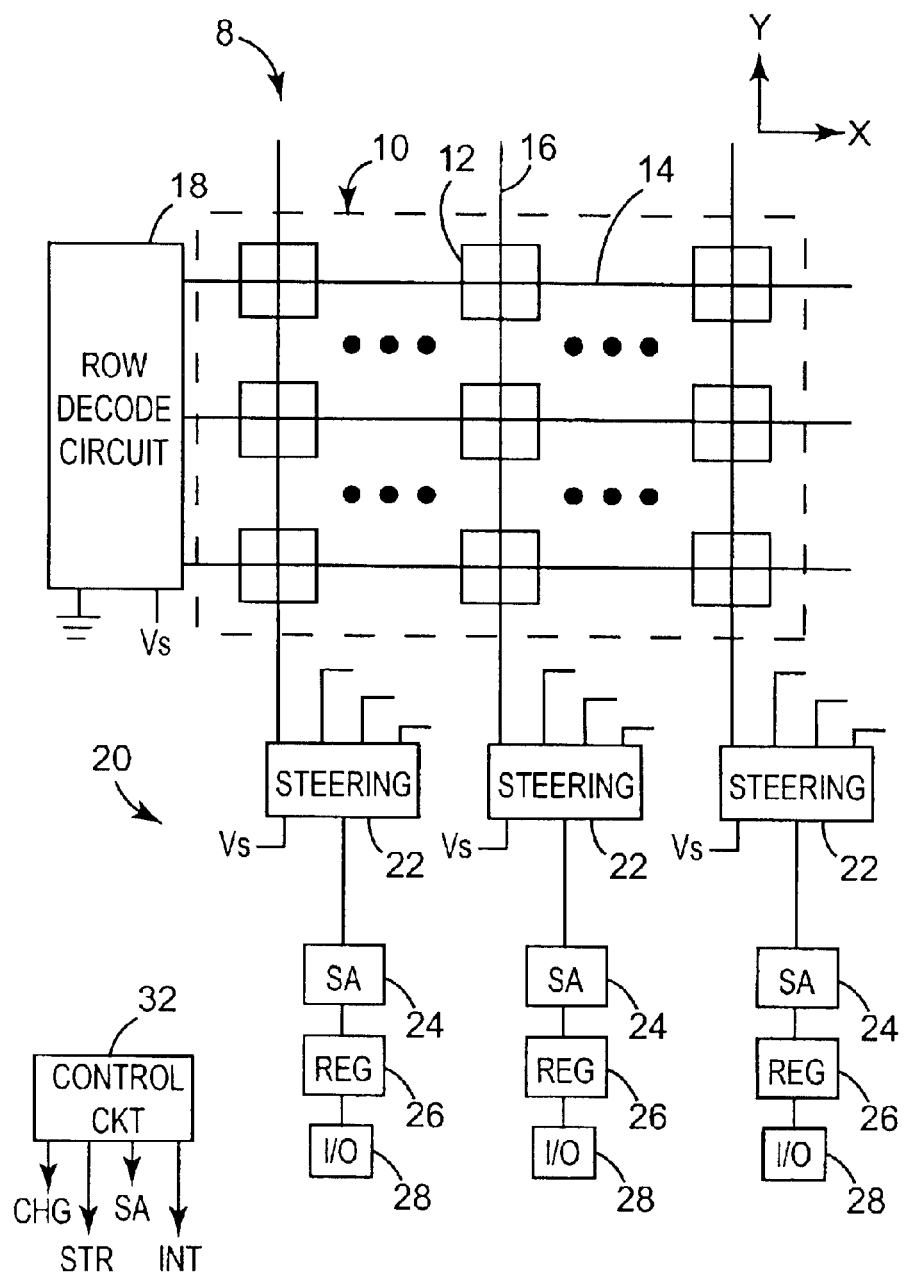
FIG. 1 is a diagram illustrating an exemplary embodiment of a magnetic memory according to the present invention.

FIG. 1 is a diagram illustrating an exemplary embodiment of a magnetic memory according to the present invention. Magnetic memory 8 includes an array 10 of magnetic memory cells 12. The magnetic memory cells 12 are arranged in rows and columns, with the rows extending along an x-direction and the columns extending along a y-direction. Only a relatively small number of magnetic memory cells 12 are shown to simplify the description of magnetic memory 8. In various embodiments, arrays of any suitable size are used.

Traces functioning as word lines 14 extend along the x-direction in a plane on one side of the memory cell array 10. Traces functioning as bit lines 16 extend along the y-direction in a plane on an adjacent side of the memory cell array 10. There is one word line 14 for each row of the array 10 and one bit line 16 for each column of the array 10. Each memory cell 12 is located at a cross-point of a corresponding word line 14 and bit line 16.

The magnetic memory cells 12 are not limited to any particular type of device. Magnetic memory cells 12 may be, for example, spin dependent tunneling ("SDT") junction devices, anisotropic magnetoresistance (AMR) devices, giant magnetoresistance (GMR) devices, colossal magnetoresistance devices, extraordinary magnetoresistance devices or very large magnetoresistance devices.

Magnetic memory 8 includes a row decode circuit 18. During read operations, the row decode circuit 18 applies either a constant array voltage ($V_s$) or a ground potential to the word lines 14. In one embodiment, the constant array voltage ($V_s$) is provided by an external circuit.

Magnetic memory 8 includes a write circuit for orienting the magnetization of selected magnetic memory cells 12 during write operations. The write circuit is not shown in order to simplify the explanation of the magnetic memory 8.

Magnetic memory 8 includes a read circuit 20 for sensing the resistance states of selected magnetic memory cells 12 during read operations. Read circuit 20 includes a plurality of steering circuits 22 and sense amplifiers 24. Multiple bit lines 16 are connected to each steering circuit 22. Although only one bit line 16 is illustrated as being connected to each steering circuit 22, in other embodiments, any suitable number of bit lines 16 can be connected to each steering circuit 22. In the illustrated embodiment, each steering circuit 22 includes a set of switches that connect each bit line 16 to a sense amplifier 24. An output of the sense amplifier 24 is supplied to a data register 26, which, in turn, is coupled to an Input/Output pad 28.

Magnetic memory 8 also includes a control circuit 32 for generating signals which include a capacitor charge signal (CHG), an address strobe signal (STR), a signal (SA) that controls the reset, preset, arm and store of the sense amplifiers 24, and an integrator control signal (INT) that controls the "settle" and "integration" phases of the read operations. The control circuit 32 generates other signals for controlling the read and write operations of magnetic memory 8 which are not illustrated to simplify the explanation of magnetic memory 8. In one embodiment, control circuit 32 is implemented as a state machine which is physically close to the memory cell array 10. In other embodiments, an external memory controller is used to generate the control signals. In other embodiments, a microprocessor or a microcontroller is used to generate the control signals.

Figures 2A, 2B:
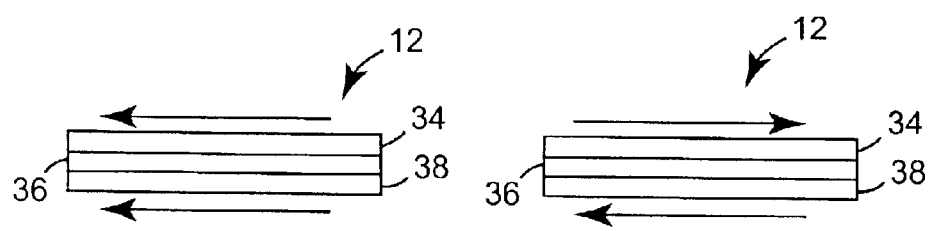
FIGS. 2A and 2B are diagrams illustrating parallel and anti-parallel magnet orientations of a magnetic memory cell.

FIGS. 2A and 2B are diagrams illustrating parallel and anti-parallel magnet orientations of a magnetic memory cell 12. In the illustrated embodiment, magnetic memory cell 12 is a STD junction device. Magnetic memory cell 12 includes a magnetic layer referred to as data storage layer 34, a magnetic layer referred to as reference layer 38, and a tunnel barrier 36 disposed between data storage layer 34 and reference layer 38. Data storage layer 34 is referred to as a "free" layer because it has a magnetization orientation that is not pinned and which can be oriented in either of two directions along the easy axis which lies in a plane. Reference layer 38 is referred to as a "pinned" layer because it has a magnetization that is oriented in a plane but is fixed so as not to rotate in the presence of an applied magnetic field within a range of interest. FIG. 2A illustrates by arrows a "parallel" orientation when the magnet orientation of the free and pinned layers 34 and 38 are in the same direction. FIG. 2B illustrates by arrows an "anti-parallel" orientation when the magnetization of the free and pinned layers 34 and 38 are in opposite directions.

The insulating tunnel barrier 36 enables quantum mechanical tunneling to occur between the free and pinned layers. This tunneling phenomenon is electron spin-dependent, making the resistance of the spin-dependent tunneling device a function of the relative orientations of the magnetization of the free and pinned layers 34 and 38. The resistance of magnetic memory cells 12 is a first value R if the orientation of magnetization of the free and pinned layers 34 and 38 is parallel as illustrated in FIG. 2A. The resistance of magnetic memory cell 12 is increased to a second value R+ΔR when the orientation of magnetization is changed from parallel to anti-parallel as illustrated in FIG. 2B.

Data is stored in magnetic memory cell 12 by orienting the magnetization along the easy axis of free layer 34. In one embodiment, a logic state of "0" is stored in magnetic memory cell 12 by orienting the magnetization of free layer 34 such that the magnetization orientation is parallel, and a logic state of "1" is stored in magnetic memory cell 12 by orienting the magnetization of free layer 34 such that the magnetization orientation is anti-parallel. In another embodiment, a logic state of "1" is stored in magnetic memory cell 12 by orienting the magnetization of free layer 34 such that the magnetization orientation is parallel, and a logic state of "0" is stored in magnetic memory cell 12 by orienting the magnetization of free layer 34 such that the magnetization orientation is anti-parallel.

Figure 3:
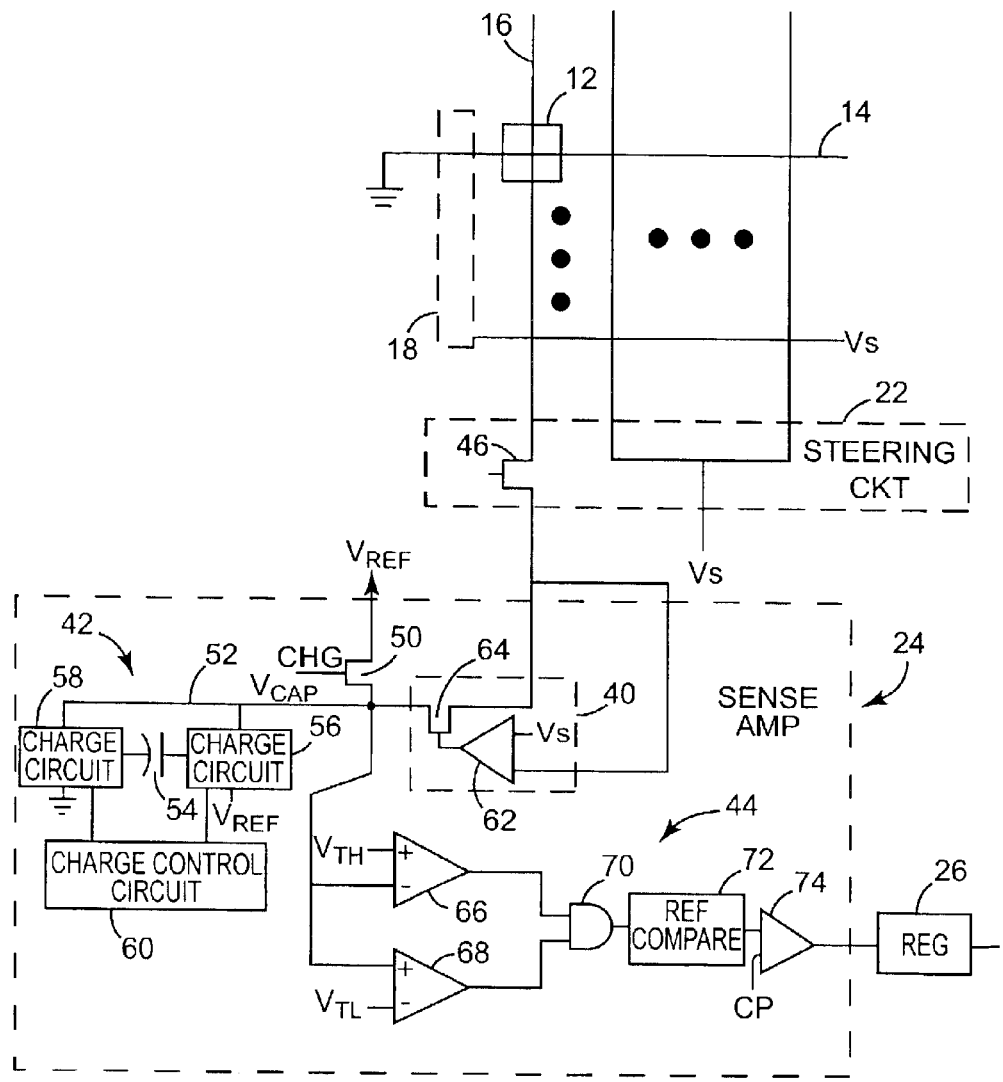
FIG. 3 is a diagram illustrating an exemplary embodiment of a sense amplifier for the magnetic memory of FIG. 1.

FIG. 3 is a diagram illustrating an exemplary embodiment of a sense amplifier 24 for the magnetic memory of FIG. 1. In the exemplary embodiment, sense amplifier 24 includes a direct injection charge amplifier 40, a capacitor switch circuit 42 and detect logic 44. A steering circuit switch 46 couples the charge amplifier 40 and capacitor switch circuit 42 to the selected bit line 16. A switch 50, which is part of the sense amplifier 24, couples the capacitor switch circuit 42 to a source providing a $V_{REF}$ voltage. Other unselected bit lines 16 and unselected word lines 18 are held at an array voltage $V_S$.

During a first of two read operations, a capacitor 54 is charged to an initial reference voltage $V_{REF}$ by application of the capacitor charge signal CHG which turns switch 50 on into a conductive state. The capacitor is discharged or charged with a first sense current flowing through the capacitor 54 and through a selected memory cell 12 which is storing an unknown logic state, while holding the selected bit line 16 is at the array voltage $V_S$. If the resistance state of the memory cell is R, the capacitor 54 will be charged or discharged faster than if the resistance state of the memory cell is R+ΔR.

For the second read operation, a known logic state is stored in the selected memory 12 or in another memory cell 12. The capacitor 54 is charged or discharged with a second read operation by a second sense current flowing in a second direction through the capacitor 54 and through the memory cell 12 which is storing the known logic state, and the final voltage on capacitor 54 is compared to the initial reference voltage $V_{REF}$. If the final voltage on capacitor 54 is within a threshold voltage range from $V_{REF}$, the unknown and known logic states are deemed to be the same (e.g., the first and second read operations are performed for the R resistance state or the R+ΔR resistance state). If the final capacitor 54 voltage is not within the threshold voltage range from $V_{REF}$, the unknown and known logic states are deemed to be different (e.g., the first and second read operation is performed for the R and the R+ΔR resistance states, or for the R+ΔR and the R resistance states, respectively). Because the resistance of memory cells 12 having the R resistance state or the R+ΔR resistance state can vary, the threshold voltage range should be sufficiently large so that when the first and second read operations are performed on the memory cells 12, the final voltage is within the threshold voltage range.

Charge amplifier 40 includes an operational amplifier 62 and a control transistor 64. Amplifier 62 controls the gate of transistor 64 to maintain the voltage at selected bit line 16 at the voltage $V_S$.

Capacitor switch circuit 42 includes the capacitor 54, charge circuits 56 and 58, and a charge control circuit 60. Capacitor switch circuit 42 enables charge capacitor 54 to be coupled to and charged in a first or second direction from charge amplifier 40. Charge control circuit 60 selects for the first direction either charge circuit 56 or 58 to connect capacitor 54 to line 52, and selects for the second direction either charge circuit 58 or 56 to connect capacitor 54 to line 52. In other embodiments, capacitor switch circuit 42 includes one or more mirror current sources configured to charge or discharge capacitor 54 in the first or the second direction. In these embodiments, the voltage level at line 52 is greater than the array voltage $V_S$.

Detect logic 44 includes comparators 66 and 68 and an AND gate 70. Comparators 66 and 68 compare the final $V_{CAP}$ voltage at capacitor 54 to an upper threshold voltage value $V_{TH}$ and to a lower threshold value voltage $V_{TL}$. Both the comparators 66 and 68 provide an output if the final $V_{CAP}$ voltage is between the voltage values of $V_{TH}$ and $V_{TL}$. If the final $V_{CAP}$ voltage is greater than $V_{TH}$, only comparator 68 provides an output. If the voltage $V_{CAP}$ is less than $V_{TL}$, only comparator 66 provides an output. AND gate 70 provides an output if both of the comparators 66 and 68 provide an output thus indicating that the final $V_{CAP}$ voltage is between the threshold voltage values of $V_{TH}$ and $V_{TL}$. In the exemplary embodiment, reference compare circuit 72 compares the output of AND gate 70 to the known logic state from the second read operation and provides an output to register 26. In one embodiment, the reference compare circuit 72 stores the known logic state. In other embodiments, the known logic state is stored in another location in magnetic memory 8, or is stored externally to magnetic memory 8. A gated buffer 74 is included in the exemplary embodiment to pass valid data from the compare circuit 72 to the output register 26 when the clock pulse (CP) is asserted.

In the illustrated embodiment, magnetic memory 8 is fabricated using a complementary metal-oxide semiconductor (CMOS) process. In other embodiments, magnetic memory 8 is fabricated using other suitable processes.

Figure 4:
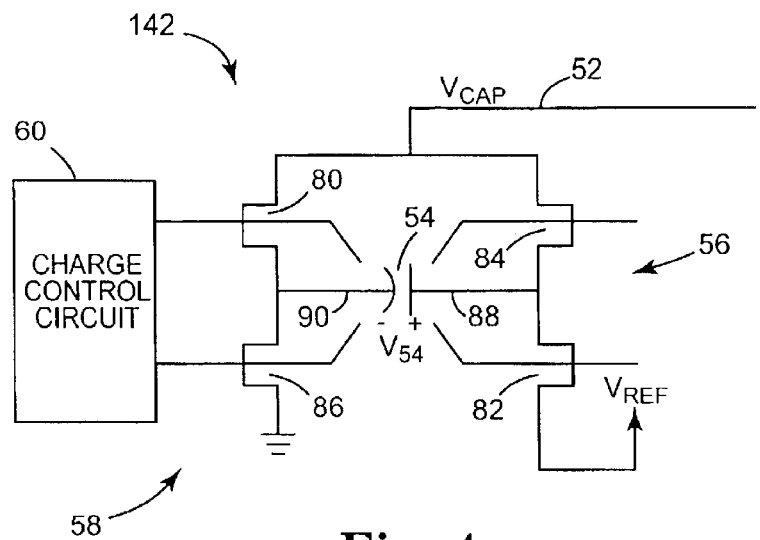
FIG. 4 is a diagram illustrating an exemplary embodiment of a capacitor switch circuit.

FIG. 4 is a diagram illustrating an exemplary embodiment of a capacitor switch circuit. The capacitor switch circuit is illustrated at 142 and includes the charge control circuit 60, capacitor 54, charge circuit 58 which includes switches 80 and 86, and charge circuit 56 which includes switches 82 and 84. Charge control circuit 60 couples capacitor 54 to line 52 through switch 80 or switch 84, and couples the other end of capacitor 54 to the voltage $V_{REF}$ or ground, respectively, through switch 82 or switch 86. In other embodiments, a voltage control circuit is included between line 52 and switches 80 and 84 to maintain the voltage at line 52 at a level which is greater than the voltage $V_S$.

In the illustrated embodiment, a first terminal 88 of capacitor 54 is connected between switches 82 and 84, and a second terminal 90 of capacitor 54 is connected between switches 80 and 86. The voltage across capacitor 54 is illustrated as $V_{54}$ and is the voltage between first terminal 88 and second terminal 90. In the illustrated embodiment, the polarity of first terminal 88 is positive with respect to second terminal 90. In other embodiments, the polarity of second terminal 90 is positive with respect to first terminal 88. In one embodiment, charge control circuit 60 turns switches 84 and 86 on into a conductive state so that first terminal 88 is connected to the charge amplifier 40 and second terminal 90 is connected to ground. The first sense current is conducted between first terminal 88 and charge amplifier 40. Charge control circuit 60 turns off switches 84 and 86 and turns switches 80 and 82 on into a conductive state so that second terminal 90 is connected to the charge amplifier 40 and first terminal 88 is connected to the voltage $V_{REF}$. The second sense current is conducted between second terminal 90 and charge amplifier 40, in a direction through capacitor 54 which is opposite to the first sense current. In a second embodiment, charge control circuit 60 turns switches 80 and 82 on into a conductive state so that second terminal 90 is connected to the charge amplifier 40 and first terminal 88 is connected to the voltage $V_{REF}$. The first sense current is conducted between second terminal 88 and charge amplifier 40. Charge control circuit 60 turns switches 80 and 82 off and turns switches 84 and 86 on into a conductive state so that first terminal 88 is connected to the charge amplifier 40 and second terminal 90 is connected to ground. The second sense current is conducted between first terminal 88 and charge amplifier 40, in a direction through capacitor 54 which is opposite to the first sense current.

In other embodiments, other capacitor switch circuits are used which can direct the first and second sense currents in opposite directions through capacitor 54. In other embodiments, the charge control circuit 60 is controlled by control circuit 32 or by means external to magnetic memory 8. In other embodiments, charge control circuit 60 is not used and the switches 80, 82, 84 and 86 are controlled by control circuit 32 or by means external to magnetic memory 8.

Figure 5:
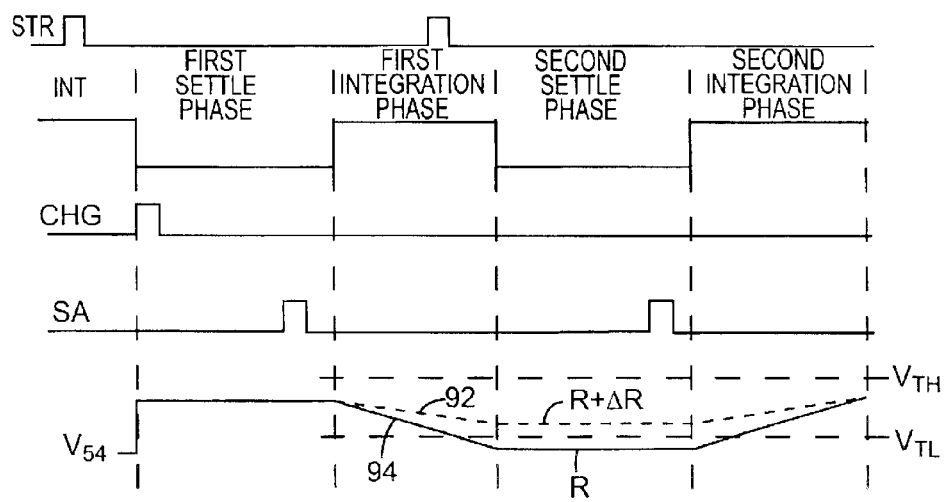
FIG. 5 is a diagram illustrating an exemplary embodiment of signals generated during memory cell read operations.

FIG. 5 is a diagram illustrating an exemplary embodiment of signals generated during memory cell read operations. In the exemplary embodiment, a first read operation reads an unknown logic state or unknown resistance state stored in the selected magnetic memory cell 12 and a second read operation reads a known logic state or resistance state stored in the same selected magnetic memory cell 12. In another embodiment, the second read operation reads the second logic state or second resistance state from another magnetic memory cell 12.

In the exemplary embodiment, an address is selected by connecting a selected word line 14 to the ground potential, and the address select strobe signal STR sets the word line address. A selected bit line 16 is coupled to the input of the charge amplifier 40 and a subset of unselected bit lines 16 and unselected word lines 18 are coupled to the array voltage $V_S$. The voltage $V_S$ applied to the unselected bit lines 16 and unselected word lines 18 has the same magnitude as the voltage applied to the selected bit line 16. Next, a settle phase illustrated as a first settle phase is initiated by connecting the output of the charge amplifier 40 at line 52 to the reference voltage $V_{REF}$. Charge control circuit 60 couples capacitor 54 in a first of two positions to line 52 so that capacitor 54 can be charged to the reference potential voltage $V_{REF}$ in the first direction. The CHG signal applied to the gate of switch 50 couples capacitor 54 to the $V_{REF}$ voltage source for a time sufficient to charge capacitor 54 to the $V_{REF}$ voltage level. The charge amplifier 40 applies the regulated voltage $V_S$ to the selected bit line 16. The first settle phase enables all voltage and current transients in the sense amplifier 24 to settle down to suitably low levels before the first sense current is sensed. In one embodiment, the charge amplifier 40 is ideal and does not have any offsets so the first sense current becomes immediately stable and the first sense current is sensed without the settle phase. In various embodiments, settle phase periods of various suitable lengths are used before the sense current is sensed. In the illustrated embodiment, the charge amplifier 40 has offsets which can cause transients in the first sense current.

Once the transients have settled, an integration phase illustrated as a first integration phase begins. Just before the first integration phase begins, however, sense amplifier 24 is reset, preset and armed by the control signal SA. The integration phase begins by discharging or charging the integration capacitor 54 with the first sense current. In the illustrated embodiment, capacitor 54 is discharged. The voltage $V_{54}$ on the integration capacitor 54 decays at a rate that is dependent upon the resistance of the selected memory cell 12. The capacitor voltage $V_{54}$ will fall slower if the selected memory cell 12 has a higher resistance R+ΔR and the capacitor voltage $V_{54}$ will fall faster if the selected memory cell 12 has a lower resistance R.

The first integration phase has a suitable period which keeps $V_{CAP}$ at a value which is greater than the array voltage $V_S$ at the end of the first integration phase. In the exemplary embodiment, a write operation is performed to write a second known logic state or resistance state into the same selected magnetic memory cell that the first read operation was performed on. Due to variations in the memory cell 12 resistance values of R and R+ΔR across the array 10, reading the first and second logic states or resistance states from the same memory cell 12 reduces the effects of these variations. In other embodiments, the second logic state or resistance state is written into a different magnetic memory cell 12 which is coupled to sense amplifier 24. The write operation to write the known memory cell logic state is not illustrated in FIG. 5 to simplify the description of the signals generated during the read operations.

In the exemplary embodiment, the second read operation reads the known logic state (or second logic state or second resistance state) which is written in the same selected memory cell 12 in which the unknown logic state (or first logic state or first resistance state) was read from. The address of the selected memory cell 12 which is storing the second logic state or resistance state is selected by connecting a selected word line 14 to the ground potential wherein the address select strobe signal STR sets the word line address. The selected bit line 16 is coupled to the input of charge amplifier 40 and the subset of unselected bit lines 16 and unselected word lines 18 are coupled to the array voltage $V_S$.

During the second settle phase, capacitor 54 is isolated by high impedance switches 80, 82, 84, and 86 and switch 50 is turned on with signal CHG so that the node $V_{CAP}$ is connected to $V_{REF}$ to supply current to the sense amplifier 40. Once the transients have settled, and before the second integration phase begins, sense amplifier 24 is reset, preset and armed by the control signal SA. At the beginning of the second integration phase, switch 50 is turned off with signal CHG and switches 80 and 82 are turned on. The capacitor voltage $V_{54}$ at the beginning of the second integration phase is the same level as at the end of the first integration phase and $V_{CAP}$ is set to $V_{REF}$ minus $V_{54}$.

During the second integration phase, the capacitor 54 is charged with the second sense current now flowing in the second direction through capacitor 54. In other embodiments, capacitor 54 is discharged during the second integration phase. The voltage $V_{54}$ on the integration capacitor 54 increases at a rate that is dependent upon the resistance of the selected memory cell 12. The capacitor voltage $V_{54}$ will increase slower if the selected memory cell 12 has a higher resistance R+ΔR, and the capacitor voltage $V_{54}$ will increase faster if the selected memory cell 12 has a lower resistance R.

At the end of the second integration phase, the final $V_{54}$ voltage on the capacitor is compared to the initial reference $V_{54}$ voltage at the beginning of the first integration phase to determine if the same or different memory cell logic states or resistance states were measured during the first and second integration phases. Two threshold values are defined as an upper threshold level $V_{TH}$ and a lower threshold level $V_{TL}$. These two threshold values define the threshold voltage range. If the final $V_{54}$ voltage is within this range, then the second read operation result is for the same memory cell logic state or resistance state as the first read operation result. The second logic state or resistance state is stored in reference comparison circuit 72 so that the logic state or resistance state read during the first read operation can be determined. In FIG. 5, line 92 illustrates the voltage $V_{54}$ in an exemplary embodiment wherein the first and second read operation results are the same and the memory cell logic state or resistance state is R+ΔR. Line 94 illustrates the voltage $V_{54}$ in an exemplary embodiment wherein the first and second read operation results are the same and the memory cell logic state or resistance state is R. For both lines 92 and 94, the final $V_{54}$ voltage is between the upper threshold level $V_{TH}$ and the lower threshold level $V_{TL}$ which illustrates that the first read operation result is the same as the second read operation result and the first logic state or resistance state is the same as the second logic state or resistance state.

In the exemplary embodiment, at the end of the second integration phase, comparators 66 and 68 provide a result of comparing the final $V_{54}$ voltage to the upper threshold voltage $V_{TH}$ and the lower threshold voltage $V_{TL}$. In the illustration of FIG. 5, both comparators 66 and 68 provide an output because the final $V_{54}$ voltage in the exemplary embodiment is between the threshold voltage values of $V_{TH}$ and $V_{TL}$. In the exemplary embodiment, AND gate 70 provides an output because both comparators 66 and 68 are providing an output. Because the first read operation result is the same as the second read operation result in the illustration of FIG. 5, the stored logic state for the first read operation is known. In the exemplary embodiment, the clock pulse CP is initiated at the end of the second integration phase and the logic state for the first read operation is passed to register 26. In the exemplary embodiment, if the second read operation result is not the same as the first read operation result for the same selected memory cell 12, the stored logic state for the first read operation result is rewritten into the same selected memory cell 12.

FIGS. 6A–6D are exemplary diagrams illustrating the capacitor voltage during read operations of the memory cells 12. In the exemplary FIGS. 6A–6D, the first integration phase corresponds to the time between time $T_0$ and time $T_1$. The second settlement phase corresponds to the time between time $T_1$ and time $T_2$. The second integration phase corresponds to the time between time $T_2$ and time $T_3$. The exemplary FIGS. 6A–6D illustrate read operations.

Figure 6A:
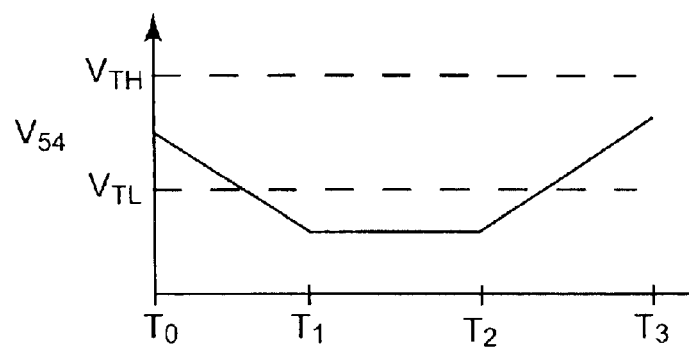
FIGS. 6A–6D are exemplary diagrams illustrating the capacitor voltage during read operations of magnetic memory cells.

In the exemplary diagram of FIG. 6A, the first and second read operations read the same stored memory cell state wherein the selected memory cell has the resistance state R. The capacitor voltage $V_{54}$ falls and rises more quickly than if the memory cell had the higher resistance R+ΔR. The final $V_{54}$ voltage at time $T_3$ is between $V_{TH}$ and $V_{TL}$, indicating that the first and second read operations are for the same memory cell state. Because the stored memory cell state for the second read operation is known, the memory cell state for the first read operation is known.

Figure 6B:
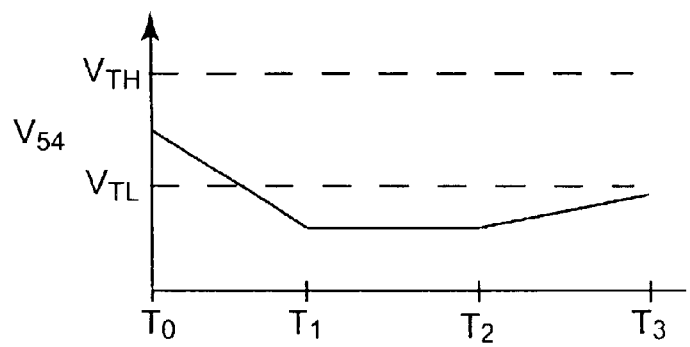

In the exemplary diagram of FIG. 6B, the first and second read operations read different stored memory cell states. The first read operation reads the memory cell state corresponding the resistance R and the second read operation reads the memory cell state corresponding to the resistance R+ΔR. The capacitor voltage $V_{54}$ falls quickly during the first integration phase when reading the resistance state R and rises slowly when reading the resistance R+ΔR. Because the higher resistance results in a lower sense current, the final $V_{54}$ voltage at time $T_3$ is less than $V_{TL}$, indicating that the first and second read operations are for different memory cell states. Because the stored memory cell state for the second read operation is known, the memory cell state for the first read operation is known.

Figure 6C:
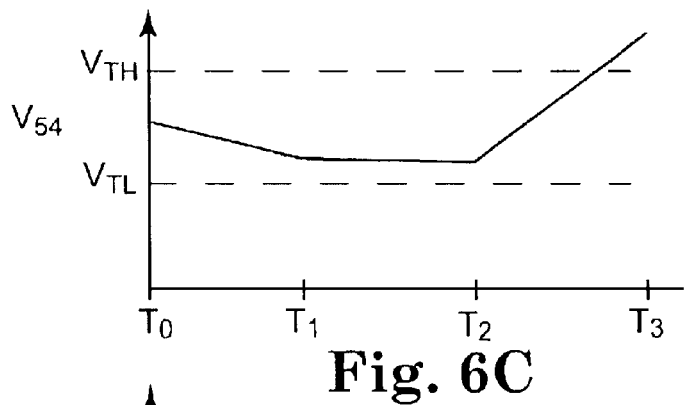

In the exemplary diagram of FIG. 6C, the first and second read operation reads different stored memory cell states. The first read operation reads the memory cell state corresponding the resistance R+ΔR and the second read operation reads the memory cell state corresponding to the resistance R. The capacitor voltage $V_{54}$ falls slowly during the first integration phase when reading the resistance state R+ΔR and rises quickly when reading the resistance R. In this illustration, the $V_{54}$ voltage at time $T_3$ is greater than the initial $V_{54}$ reference voltage at time $T_1$ because the lower resistance during the second integration phase allows a higher sense current to charge the capacitor voltage. The final $V_{54}$ voltage at time $T_3$ is greater than $V_{TH}$ indicating that the first and second read operations are for different memory cell states. Because the stored memory cell state for the second read operation is known, the memory cell state for the first read operation is known.

Figure 6D:
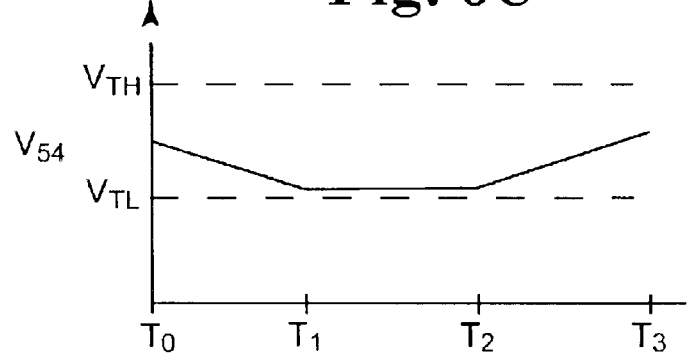

In the exemplary diagram of FIG. 6D, the first and second read operations read the same stored memory cell state. The selected memory cell has the resistance state R+ΔR. The capacitor voltage $V_{54}$ falls and rises more slowly than if the memory cell had the lower resistance R, as illustrated in FIG. 6A. The final $V_{54}$ voltage at time $T_3$ is between $V_{TH}$ and $V_{TL}$, indicating that the first and second read operations are for the same memory cell state. Because the stored memory cell state for the second read operation is known, the memory cell state for the first read operation is known.

Although the exemplary diagrams for FIGS. 6A–6D illustrate the capacitor being discharged during the first integration phase and charged during the second integration phase, in other embodiments, the capacitor can be charged during the first integration phase and discharged curing the second integration phase.

What is claimed is:

1. A magnetic memory, comprising:
    a memory cell; and
    a sense amplifier coupled to the memory cell, wherein the sense amplifier comprises:
    a capacitor operative between a first voltage established by a first sense current flowing in a first direction and a second voltage established by a second sense current flowing in an opposite direction, the first sense current corresponding to an unknown logic state of the memory cell and the second sense current corresponding to a known logic state of the memory cell; and
    detect logic configured to compare the second voltage to an upper threshold voltage and a lower threshold voltage and provide the known logic state if the second voltage is less than the upper threshold voltage and greater than the lower threshold voltage, and provide a logic state opposite to the known logic state if the second voltage is equal to or greater than the upper threshold voltage or is equal to or less than the lower threshold voltage.

2. The magnetic memory of claim 1, wherein the detect logic comprises:
    a first comparator configured to compare the upper threshold voltage to the second voltage and provide a first output if the second voltage is less than the upper threshold voltage; and
    a second comparator configured to compare the second voltage to the lower threshold voltage and provide a second output if the second voltage is greater than the lower threshold voltage.

3. The magnetic memory of claim 2, wherein the detect logic comprises:
    comparison logic coupled to the first and second comparators configured to provide the known logic state if the first and second comparators are providing the first and second output and to provide the logic state opposite to the known logic state if the first comparator is not providing the first output or the second comparator is not providing the second output.

4. The magnetic memory of claim 3, wherein the detect logic is configured to store the second logic state.

5. The magnetic memory of claim 1, wherein the first sense current flowing in the first direction through the capacitor decreases a voltage on the capacitor and the second sense current flowing in the opposite direction through the capacitor increases the voltage on the capacitor.

6. The magnetic memory of claim 1, wherein the first sense current flowing in the first direction through the capacitor increases a voltage on the capacitor and the second sense current flowing in the opposite direction through the capacitor decreases the voltage on the capacitor.

7. A sense amplifier for sensing a resistance state stored in a memory cell, comprising:
    a charge amplifier coupled to the memory cell;
    a capacitor coupled to the charge amplifier, wherein a voltage on the capacitor is configured to be changed from a reference voltage by a first sense current flowing in a first direction and corresponding to a first resistance state stored in the memory cell and changed to a second voltage by a second sense current flowing in a second direction and corresponding to a second resistance state stored in the memory cell, wherein the first resistance state is equal to the second resistance state if the second voltage is between an upper threshold voltage and a lower threshold voltage, and wherein the reference voltage is between the upper threshold voltage and the lower threshold voltage.

8. The sense amplifier of claim 7, wherein the first resistance state corresponds to the memory cell having either a first resistance value or a second resistance value and the second resistance state corresponds to the memory cell having either the first resistance value or the second resistance value, and wherein the second resistance value is greater than the first resistance value.

9. The sense amplifier of claim 8, wherein the first current flowing in the first direction through the capacitor decreases the voltage on the capacitor and the second current flowing in the second direction through the capacitor increases the voltage on the capacitor wherein the first resistance state corresponds to the first resistance value and the second resistance state corresponds to the second resistance value when the second voltage is less than the lower threshold voltage, and wherein the first resistance state corresponds to the second resistance value and the second resistance state corresponds to the first resistance value when the second voltage is greater than the upper threshold voltage.

10. The sense amplifier of claim 8, wherein the first current flowing in the first direction through the capacitor increases the voltage on the capacitor and the second current flowing in the second direction through the capacitor decreases the voltage on the capacitor, wherein the first resistance state corresponds to the first resistance value and the second resistance state corresponds to the second resistance value when the second voltage is greater than the upper threshold voltage, and wherein the first resistance state corresponds to the second resistance value and the second resistance state corresponds to the first resistance value when the second voltage is less than the lower threshold voltage.

11. A sense amplifier for sensing a logic state stored in a memory cell, comprising:
a charge amplifier coupled to the memory cell for conducting a first sense current and a second sense current, wherein the first sense current corresponds to a first logic state stored in the memory cell and the second sense current corresponds to a second logic state stored in the memory cell;
a capacitor coupled to the charge amplifier, wherein a voltage on the capacitor is configured to be changed from a reference voltage by the first sense current flowing in a first direction through the capacitor and changed to a second voltage by the second sense current flowing in a second direction through the capacitor; and
detect logic coupled to the capacitor configured to compare the second voltage to an upper and lower threshold voltage, wherein the first logic state is equal to the second logic state if the second voltage is between the upper and lower threshold voltage.

12. The sense amplifier of claim 11, wherein the first logic state corresponds to the memory cell having either a first resistance value or a second resistance value and the second logic state corresponds to the memory cell having either the first resistance value or the second resistance value, wherein the second resistance value is greater than the first resistance value.

13. The sense amplifier of claim 12, wherein the first current flowing in the first direction decreases the voltage on the capacitor and the second current flowing in the second direction increases the voltage on the capacitor.

14. The sense amplifier of claim 13, wherein the first logic state corresponds to the first resistance value and the second logic state corresponds to the second resistance value when the second voltage is less than the lower threshold voltage, and wherein the first logic state corresponds to the second resistance value and the second logic state corresponds to the first resistance value when the second voltage is greater than the upper threshold voltage.

15. A sense amplifier for sensing a resistance state stored in a memory cell, comprising:
a charge amplifier coupled to the memory cell for conducting a first sense current and a second sense current, wherein the first sense current corresponds to a first resistance state stored in the memory cell and the second sense current corresponds to a second resistance state stored in the memory cell;
a first charge circuit;
a second charge circuit; and
a capacitor having a first terminal coupled to the first charge circuit and a second terminal coupled to the second charge circuit, wherein the first charge circuit is configured to couple the first terminal to the charge amplifier and the second charge circuit is configured to couple the second terminal to a ground potential to conduct the first sense current through the capacitor in a first direction, and wherein the second charge circuit is configured to couple the second terminal to the charge amplifier and the first charge circuit is configured to couple the first terminal to a reference potential to conduct the second sense current through the capacitor in a second direction.

16. The sense amplifier of claim 15, wherein the first charge circuit includes:
a first switch coupled between the charge amplifier and the first terminal and configured to conduct the first sense current; and
a second switch coupled between the first terminal and the reference potential and configured to conduct the second sense current.

17. The sense amplifier of claim 16, wherein the second charge circuit includes:
a third switch coupled between the charge amplifier and the second terminal and configured to conduct the second sense current; and
a fourth switch coupled between the second terminal and the ground potential and configured to conduct the first sense current.

18. The sense amplifier of claim 17, comprising:
a charge control circuit coupled to the first, second, third and fourth switches, wherein the charge control circuit is configured to enable the first and fourth switches to conduct the first sense current and to enable the third and second switches to conduct the second sense current.

19. A magnetic memory, comprising:
a first memory cell configured to store a first logic state;
a second memory cell configured to store a second logic state; and
a capacitor coupled to the first and second memory cell, wherein a voltage on the capacitor is configured to be changed from an initial reference voltage by a first sense current flowing between the capacitor and the first memory cell in a first direction through the capacitor and by a second sense current flowing between the capacitor and the second memory cell in a second direction through the capacitor, wherein the first logic state is equal to the second logic state if a second voltage on the capacitor is within a threshold voltage range from the reference voltage.

20. The magnetic memory of claim 19, comprising:
detect logic configured to compare the second voltage to an upper and lower threshold voltage, wherein a difference between the upper and lower threshold voltage defines the threshold voltage range.

21. The magnetic memory of claim 20, wherein the detect logic includes:
a first comparator configured to compare the upper threshold voltage to the second voltage and provide a first output if the second voltage is less than the upper threshold voltage; and
a second comparator configured to compare the second voltage to the lower threshold voltage and provide a second output if the second voltage is greater than the lower threshold voltage.

22. The magnetic memory of claim 21, wherein the detect logic includes:
comparison logic coupled to the first and second comparator configured to provide the second logic state if the first and second comparator are providing the first and second output and to provide a logic state opposite to the second logic state if either the first or second comparator are not providing the first or second output.

23. A method of detecting a first logic state stored in a memory cell, comprising:
changing a voltage on a capacitor from an initial reference voltage by a first sense current flowing between the capacitor and the first memory cell in a first direction through the capacitor;

storing a second logic state in the memory cell;

changing the voltage on the capacitor to a second voltage by a second sense current flowing between the capacitor and the second memory cell in a second direction through the capacitor; and comparing the second voltage to the reference voltage to determine if the second voltage is within a threshold range from the reference voltage, wherein the first logic state is equal to the second logic state if the second voltage on the capacitor is within the threshold voltage range from the reference voltage.

24. The method of claim 23, wherein comparing the second voltage to the reference voltage comprises comparing the second voltage to an upper and lower threshold voltage, wherein a difference between the upper and lower threshold voltage defines the threshold voltage range.

25. The method of claim 24, wherein comparing the second voltage to the reference voltage includes:

comparing the upper threshold voltage to the second voltage;

comparing the second voltage to the lower threshold voltage; and providing the second logic state if the second voltage is less than the upper threshold voltage and is greater than the lower threshold voltage and providing a logic state opposite to the second logic state if the second voltage is not less than the upper threshold voltage or is not greater than the lower threshold voltage.

26. A method of detecting a first logic state stored in a memory cell, comprising:

charging a capacitor to a reference voltage;

conducting a first sense current flowing between the capacitor and the memory cell in a first direction through the capacitor;

writing a second logic state in the memory cell;

conducting a second sense current flowing between the capacitor and the memory cell in a second direction through the capacitor;

comparing a second voltage on the capacitor to an upper and lower threshold voltage, wherein the first logic state is equal to the second logic state if the second voltage is between the upper and lower threshold voltage.

* * * * *